US012804801B2

(12) United States Patent
Wu

(10) Patent No.: US 12,804,801 B2
(45) Date of Patent: Nov. 17, 2026

(54) WAVEGUIDE DEVICE

(71) Applicant: Innolux Corporation, Miaoli County (TW)

(72) Inventor: Yan-Zheng Wu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 140 days.

(21) Appl. No.: 18/912,624

(22) Filed: Oct. 11, 2024

(65) Prior Publication Data

US 2026/0101432 A1 Apr. 9, 2026

Related U.S. Application Data

(60) Provisional application No. 63/600,045, filed on Nov. 17, 2023.

(30) Foreign Application Priority Data

Jul. 31, 2024 (CN) ......................... 202411040136.5

(51) Int. Cl.
*H05K 1/02* (2006.01)
*H01P 3/02* (2006.01)
*H05K 1/11* (2006.01)

(52) U.S. Cl.
CPC ............. *H05K 1/0237* (2013.01); *H01P 3/02* (2013.01); *H05K 1/115* (2013.01)

(58) Field of Classification Search
CPC ........ H05K 1/0237; H05K 1/115; H01P 3/02; H01P 3/18; H01P 3/00
USPC .... 333/25, 26, 113, 137, 157, 208, 239, 248
See application file for complete search history.

(56) References Cited

U.S. PATENT DOCUMENTS 8,564,383 B2 * 10/2013 Shimura ................. H01P 3/121 333/26
9,543,628 B2 * 1/2017 Lee ........................... H01P 3/16
2006/0274992 A1 * 12/2006 Shimura ................... H01P 5/08 385/39

FOREIGN PATENT DOCUMENTS

CN 117423964 1/2024

* cited by examiner

*Primary Examiner* — Jorge L Salazar, Jr.
(74) *Attorney, Agent, or Firm* — JCIPRNET

(57) ABSTRACT

A waveguide device includes a waveguide structure, an electronic element, and a driving circuit. The waveguide structure includes a first conductive layer, a second conductive layer above the first conductive layer, an insulation layer between the first and second conductive layers, and a via array in the insulation layer and including first vias and at least one second via. The first vias are arranged in a first direction and on two opposite sides of the insulation layer in a second direction crossing the first direction. The first via includes a hollow portion and a conductive portion. The second via is between the two adjacent first vias in the first direction and penetrates the first and second conductive layers. The electronic element is on the waveguide structure and electrically connected to the second conductive layer. The driving circuit is under the waveguide structure and electrically connected to the electronic element.

20 Claims, 8 Drawing Sheets

WAVEGUIDE DEVICE

CROSS-REFERENCE TO RELATED APPLICATION

This application claims the priority benefit of U.S. provisional application Ser. No. 63/600,045, filed on Nov. 17, 2023, and China application serial no. 202411040136.5, filed on Jul. 31, 2024. The entirety of each of the above-mentioned patent applications is hereby incorporated by reference herein and made a part of this specification.

BACKGROUND

Technical Field

The disclosure relates to an electronic device, and in particular to a waveguide device in an electronic device.

Description of Related Art

In order to increase the communication transmission rate, the frequency used in wireless communication systems is also increasing day by day. As the wavelength becomes shorter, microwave signal control elements and antenna elements of microwave control modules in the communication systems need to be miniaturized and integrated to reduce transmission loss of microwave signals. However, this means that electrical isolation between the microwave signals (for example, radio frequency signals), digital signals, and power signals needs to be considered to maintain the normal operation of the microwave control modules. In order to implement the requirements of miniaturization of module structures and electrical isolation between different signals, multi-layer overlapping structures of metal and dielectric materials have emerged. For example, a substrate integrated waveguide (SIW) is a waveguide structure for transmitting high-frequency signals and includes a dielectric layer, metal layers disposed on two opposite surfaces of the dielectric layer, and multiple vias penetrating the dielectric layer. A microwave signal wiring layer uses different numbers of microwave signal wiring layers for microwave signal transmission according to the waveguide structure, and the microwave signal control elements usually use conductive vias to introduce the digital signals and the power signals from a digital signal wiring layer and a power wiring layer into the microwave signal wiring layer. However, if the conductive vias of the digital signals and/or the power signals are configured in the waveguide structure, the transmission characteristics of the microwave signals in the waveguide structure will be interfered, thereby affecting antenna radiation characteristics.

SUMMARY

The disclosure provides a waveguide device that integrates a via for transmitting a digital signal and/or a power signal into a via array for guiding a microwave transmission direction in a waveguide structure, which can not only satisfy the electrical connection requirements of the digital signal and/or the power signal, but can also prevent interference to microwave signals caused by an additional via for transmitting the digital signal and/or the power signal disposed outside the via array in the waveguide structure.

According to an embodiment of the disclosure, a waveguide device includes a waveguide structure, an electronic element, and a driving circuit. The waveguide structure includes a first conductor layer, a second conductor layer, an insulation layer, and a via array. The second conductor layer is disposed above the first conductor layer. The insulation layer is disposed between the first conductor layer and the second conductor layer. The via array is disposed in the insulation layer and includes multiple first vias and at least one second via. The first vias are arranged in a first direction and are configured on two opposite sides of the insulation layer in a second direction. The first direction crosses the second direction and each first via includes a hollow portion and a conductor portion surrounding the hollow portion. The at least one second via is configured between the two adjacent first vias in the first direction and penetrates the first conductor layer and the second conductor layer. The electronic element is disposed on the waveguide structure and is electrically connected to the second conductor layer. The driving circuit is disposed under the waveguide structure and is electrically connected to the electronic element through the at least one second via.

Based on the above, in the embodiments of the disclosure, the second via for transmitting the digital signal and/or the power signal is integrated into the via array for guiding the microwave transmission direction in the waveguide structure, which can not only satisfy the electrical connection requirements of the digital signal and/or the power signal, but can also prevent adding other vias for transmitting the digital signal and/or the power signal other than the via array in the waveguide structure to eliminate interference to the microwave signals.

In order for the features and advantages of the disclosure to be more comprehensible, the following specific embodiments are described in detail in conjunction with the drawings.

BRIEF DESCRIPTION OF THE DRAWINGS

The drawings are included to provide a further understanding of the disclosure, and the drawings are incorporated into the specification and constitute a part of the specification. The drawings illustrate the embodiments of the disclosure and serve to explain principles of the disclosure together with the description.

DESCRIPTION OF THE EMBODIMENTS

Figure 1:
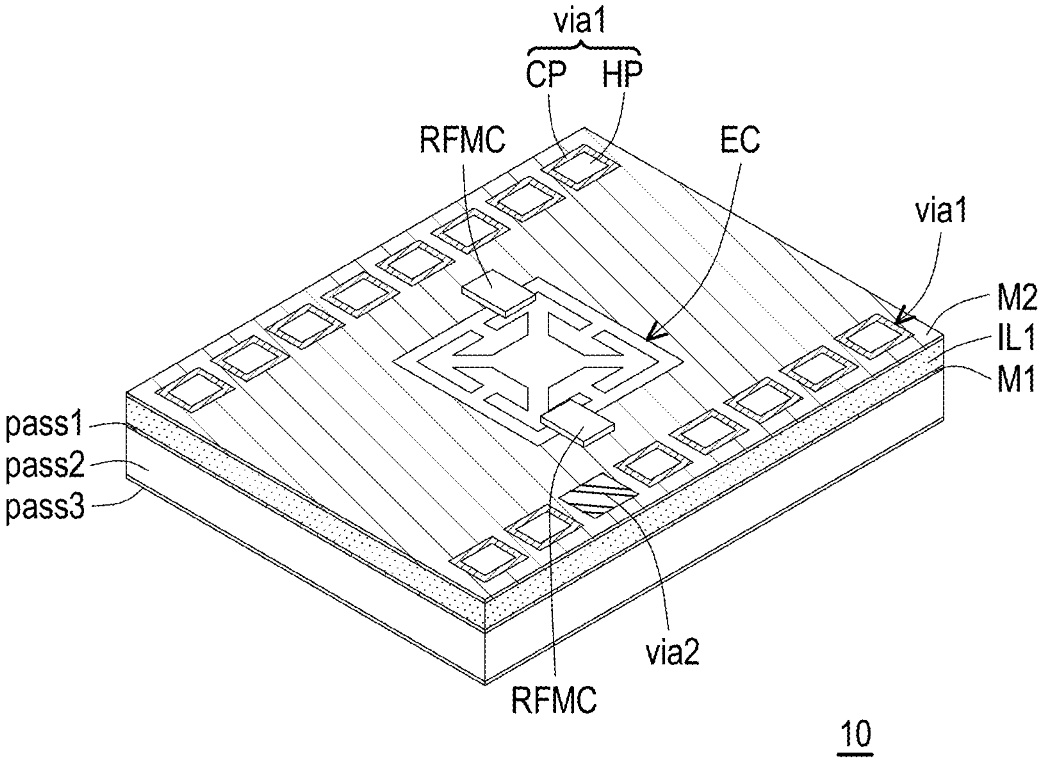
FIG. 1 is a three-dimensional schematic view of a waveguide device of an electronic device according to an embodiment of the disclosure.

The disclosure may be understood through referring to the following detailed description in conjunction with the drawings. It should be noted that in order to facilitate the understanding by the reader and the brevity of the drawings, multiple drawings in the disclosure only depict a part of an electronic device, and specific elements in the drawings are not drawn according to actual scale. In addition, the number and the size of each element in the drawings are for illustration only and are not intended to limit the scope of the disclosure. For example, the relative sizes, thicknesses, and locations of various film layers, regions, and/or structures may be reduced or exaggerated for clarity.

Throughout the specification and the appended claims of the disclosure, certain terms may be used to refer to specific elements. It should be understood by persons skilled in the art that electronic device manufacturers may refer to the same element by different names. The disclosure does not intend to distinguish between elements with the same function but different names. In the following specification and claims, terms such as "having" and "including" are open-ended terms, so the terms should be interpreted as "comprising but not limited to . . . ".

Directional terms such as "upper", "lower", "front", "rear", "left", and "right" mentioned in the disclosure are only directions with reference to the drawings. Therefore, the used directional terms are used to illustrate, but not to limit, the disclosure. It will be understood that when an element or a film layer is referred to as being "on" or "connected to" another element or film layer, the element or the film layer may be directly on or directly connected to the other element or film layer or there is an element or a film layer inserted between the two (indirect case). In contrast, when an element or a film layer is referred to as being "directly on" or "directly connected to" another element or film layer, there is no element or film layer inserted between the two. In addition, when an element or a film layer is referred to as overlapping with another element or film layer, the element or the film layer at least partially overlaps with the other element or film layer.

The term "about", "approximately", "substantially", or "roughly" generally represents falling within a 10% range of a given value or range or represents falling within a 5%, 3%, 2%, 1%, or 0.5% range of the given value or range. In addition, the terms "the given range is a first value to a second value" and "the given range falls within a range of the first value to the second value" represent that the given range includes the first value, the second value, and other values therebetween.

In some embodiments of the disclosure, terms related to bonding and connection, such as "connection" and "interconnection", unless otherwise defined, may mean that two structures are in direct contact or may also mean that two structures are not in direct contact, wherein there is another structure disposed between the two structures. The terms related to bonding and connection may also include the case where the two structures are both movable or the two structures are both fixed. In addition, the terms "electrical connection" and "coupling" include any direct and indirect means of electrical connection.

In the following embodiments, the same or similar elements adopt the same or similar numerals, and elaboration thereof is omitted. In addition, as long as features in different embodiments do not violate the spirit of the disclosure or conflict each other, the features may be arbitrarily mixed and matched for use, and simple equivalent changes and modifications made according to the specification or the claims are still within the scope of the disclosure. That is, in the following embodiments, the technical features in several different embodiments may be replaced, reorganized, and mixed without departing from the spirit of the disclosure to complete other embodiments. In addition, terms such as "first" and "second" mentioned in the specification or the claims are only used to name different elements or distinguish different embodiments or ranges and are not used to limit the upper limit or the lower limit of the number of elements, nor to limit the manufacturing sequence or the arrangement sequence of elements.

The electronic device of the disclosure may include an antenna (for example, a liquid crystal antenna), display, light emission, sensing, touch, splicing, other suitable functions, or a combination of the above functions, but is not limited thereto. The electronic device includes a rollable or flexible electronic device, but not limited thereto. A display device may include, for example, liquid crystal, a light emitting diode (LED), quantum dot (QD), fluorescence, phosphor, other suitable materials, or a combination of the above. The light emitting diode may include, for example, an organic light emitting diode (OLED), a micro LED, a mini LED, or a quantum dot light emitting diode (QLED or QDLED), but not limited thereto. An electronic element may include a transistor, a circuit board, a chip, a die, an integrated circuit (IC), a combination of the above elements, or other suitable electronic elements, but not limited thereto.

Exemplary embodiments of the disclosure are given below. The same reference numerals are used in the drawings and the description to represent the same or similar parts.

Figure 2A:
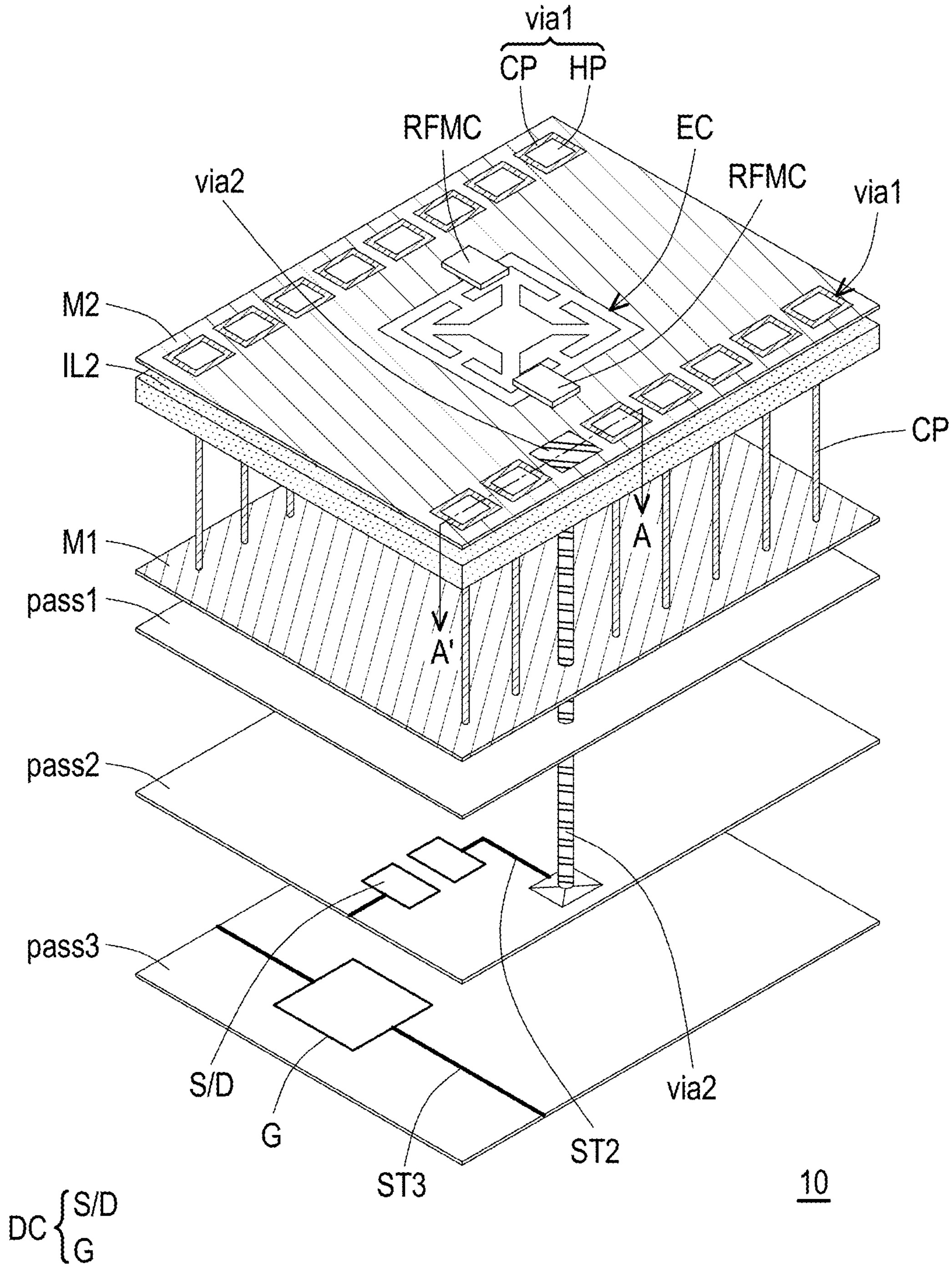
FIG. 2A is an exploded schematic view of the waveguide device of the electronic device in FIG. 1 according to an embodiment.
Figure 2B:
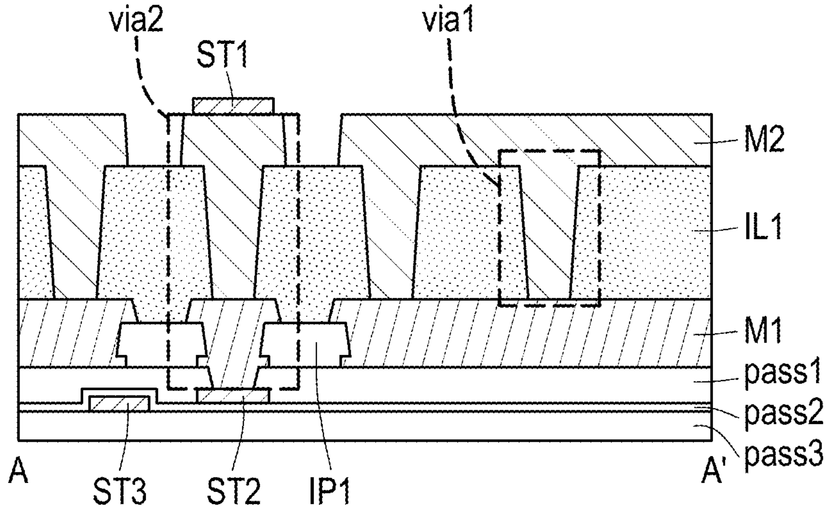
FIG. 2B is a cross-sectional schematic view taken along a line A-A' in FIG. 2A.
Figure 3A:
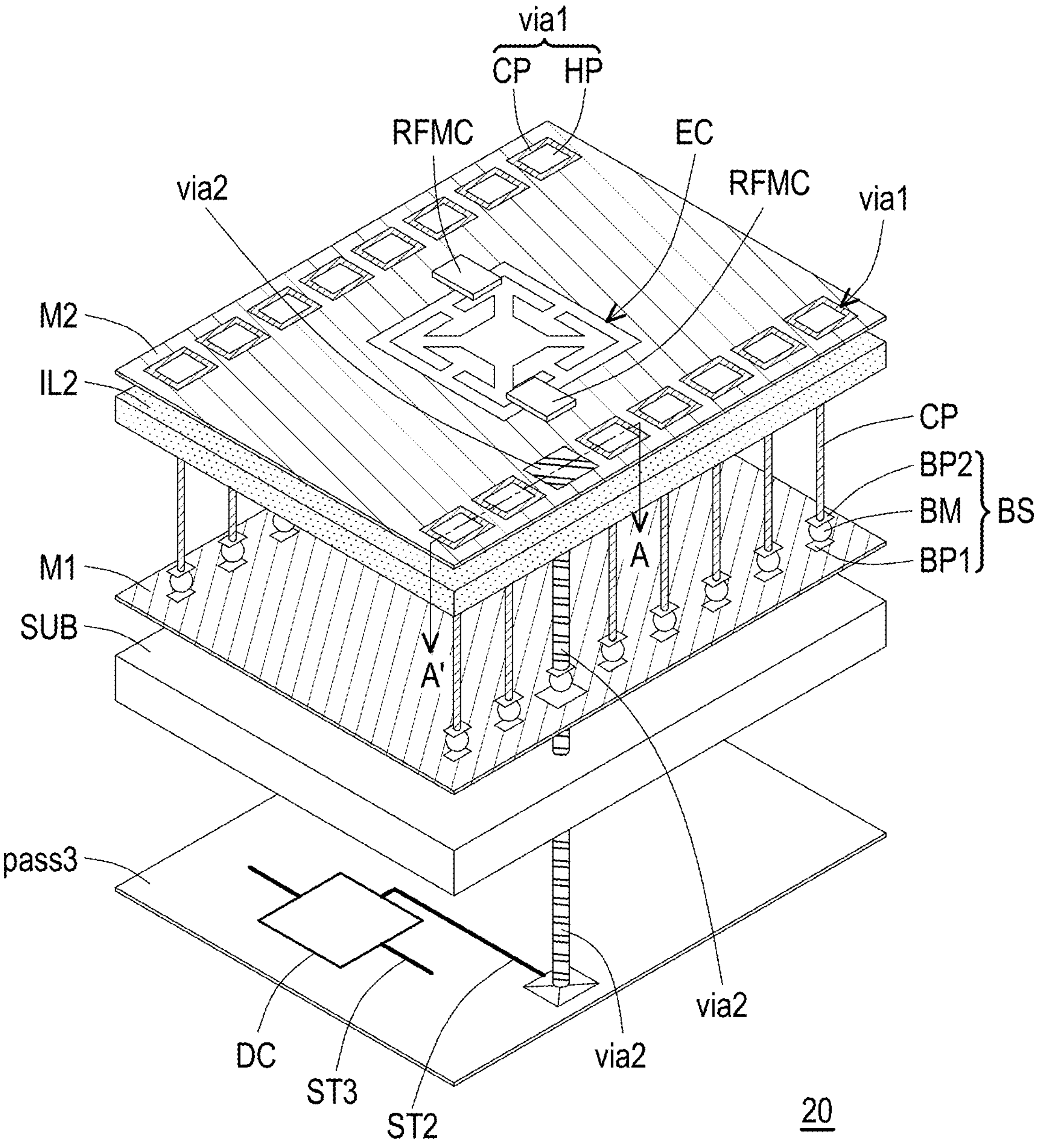
FIG. 3A is an exploded schematic view of a waveguide device according to another embodiment of the disclosure.
Figure 3B:
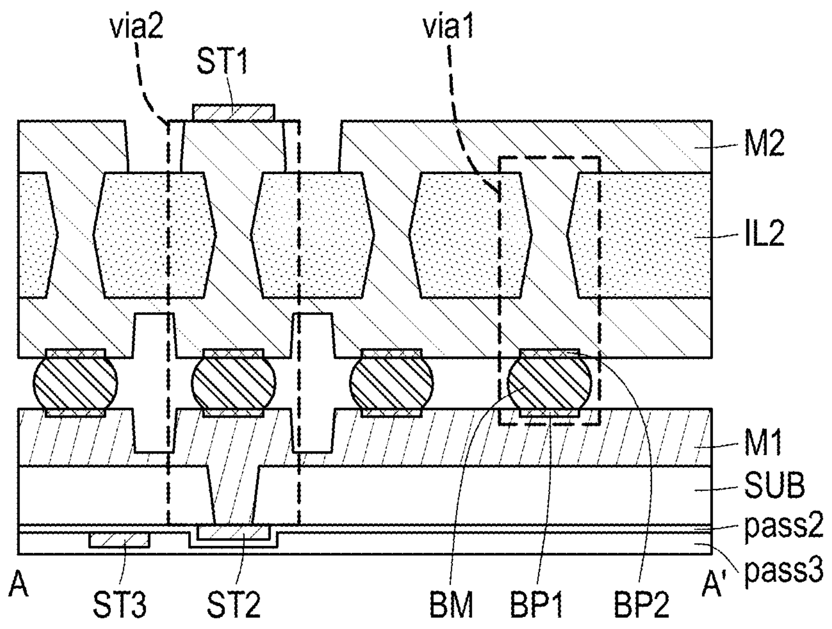
FIG. 3B is a cross-sectional schematic view taken along a line A-A' in FIG. 3A.
Figure 4:
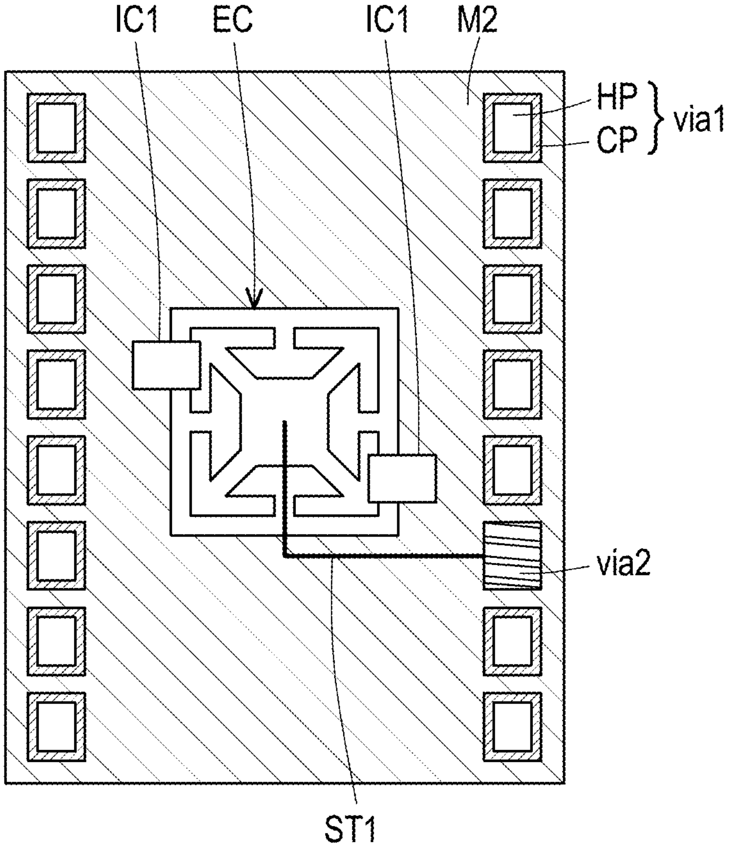
FIG. 4 is a top schematic view of a second conductor layer according to an embodiment of the disclosure.
Figure 5A:
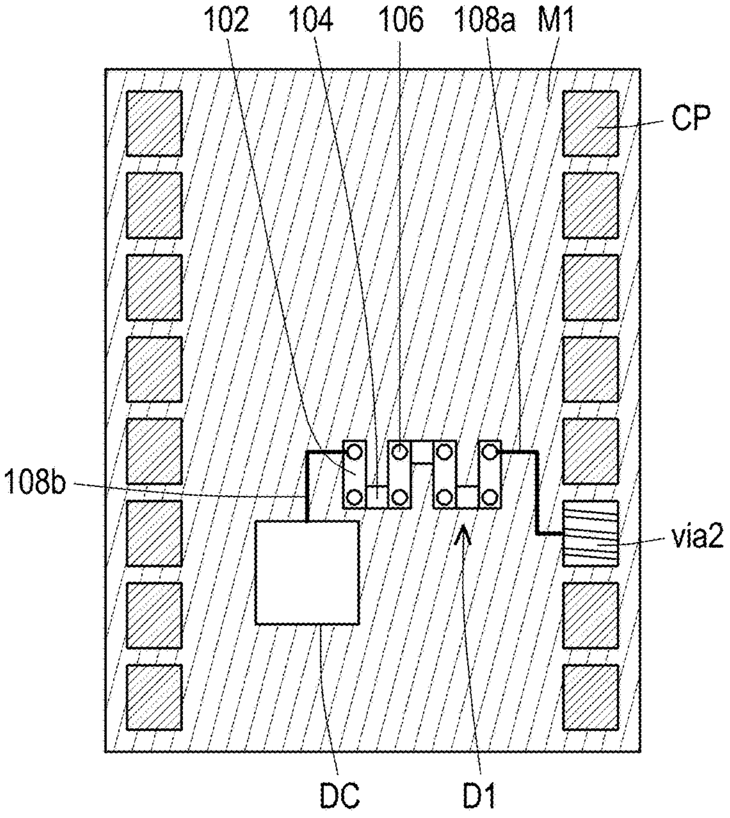
FIG. 5A is a bottom schematic view of a first conductor layer according to an embodiment of the disclosure.
Figure 5B:
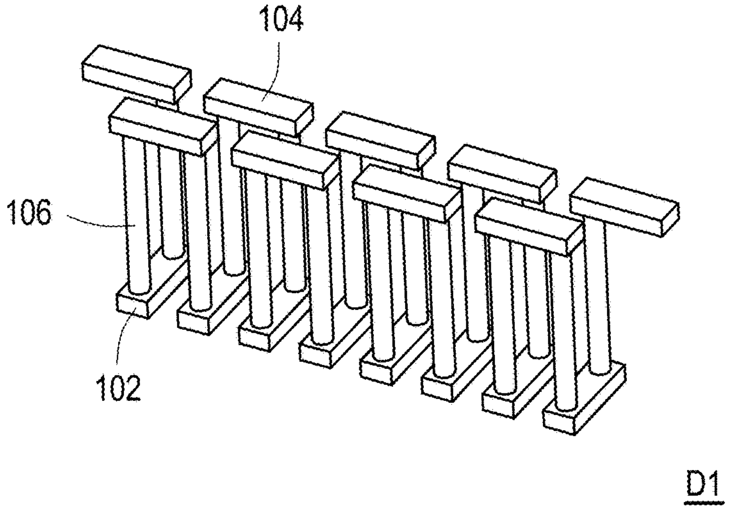
FIG. 5B is a three-dimensional schematic view of an inductance element of FIG. 5A according to an embodiment.
Figure 6A:
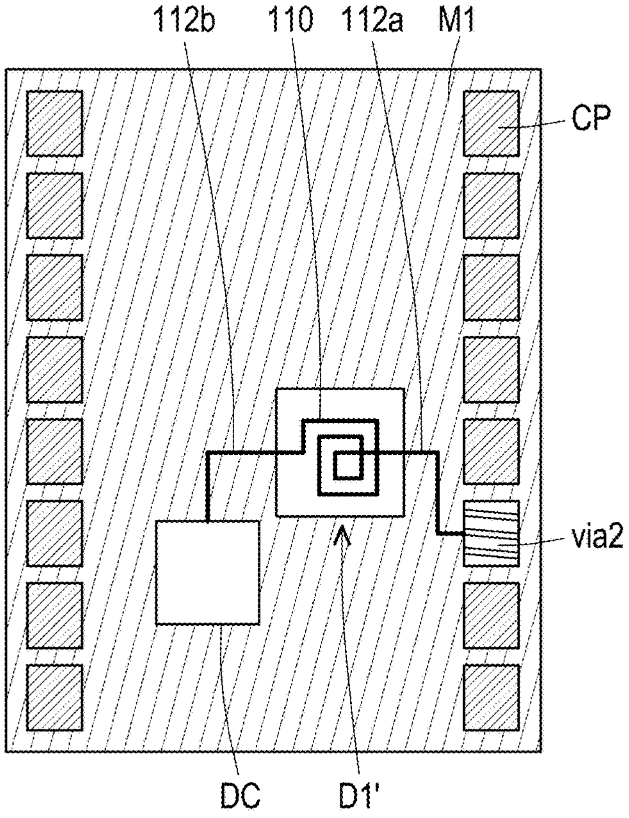
FIG. 6A is a bottom schematic view of a first conductor layer according to another embodiment of the disclosure.
Figure 6B:
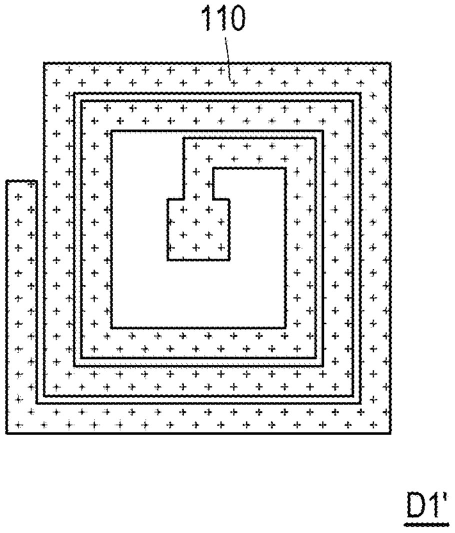
FIG. 6B is a top schematic view of an inductance element of FIG. 6A according to an embodiment.

FIG. 1 is a three-dimensional schematic view of a waveguide device of an electronic device according to an embodiment of the disclosure. FIG. 2A is an exploded schematic view of the waveguide device of the electronic device in FIG. 1 according to an embodiment. FIG. 2B is a cross-sectional schematic view taken along a line A-A' in FIG. 2A. FIG. 3A is an exploded schematic view of a waveguide device according to another embodiment of the disclosure. FIG. 3B is a cross-sectional schematic view taken along a line A-A' in FIG. 3A. FIG. 4 is a top schematic view of a second conductor layer according to an embodiment of the disclosure. FIG. 5A is a bottom schematic view of a first conductor layer according to an embodiment of the disclosure. FIG. 5B is a three-dimensional schematic view of an inductance element of FIG. 5A according to an embodiment. FIG. 6A is a bottom schematic view of a first conductor layer according to another embodiment of the disclosure. FIG. 6B is a top schematic view of an inductance element of FIG. 6A according to an embodiment. A top view direction referred to in the disclosure may be, for example, a view viewed from top to bottom in the z direction. A bottom view direction referred to in the disclosure may be, for example, a view viewed from bottom to top in the z direction.

Please refer to FIG. 1, FIG. 2A, and FIG. 2B at the same time. A waveguide device 10 includes a waveguide structure, an electronic element EC, and a driving circuit DC.

The waveguide structure includes a first conductor layer M1, a second conductor layer M2 disposed above the first conductor layer M1, an insulation layer IL1 disposed between the first conductor layer M1 and the second conductor layer M2, and a via array disposed in the insulation layer IL1. The insulation layer IL1 may include a suitable inorganic and/or organic insulation material. The first conductor layer M1 and the second conductor layer M2 may each include a suitable conductor material, such as a material with high electrical conductivity such as copper, silver, and gold.

The via array includes multiple first vias via1 and at least one second via via2. The first vias via1 are arranged in a first direction and are configured on two opposite sides of the insulation layer IL1 in a second direction. The first direction crosses the second direction. In some embodiments, the first direction and the second direction are perpendicular to each other. The second via via2 is configured between the two adjacent first vias via1 in the first direction and penetrates the first conductor layer M1 and the second conductor layer M2. In some embodiments, a distance between the first via via1 and the second via via2 may be less than one quarter of a wavelength of a radio frequency signal propagating inside the waveguide structure. The first conductor layer M1 and the second conductor layer M2 are electrically connected to each other through a conductor portion CP of each first via via1. In some embodiments, the first conductor layer M1 and the second conductor layer M2 are connected to a ground signal.

In some embodiments, the first via via1 may be a radio frequency signal shielding via. In some embodiments, the first via via1 may be a conformal metal-coated via. In other words, each first via via1 includes a hollow portion HP and the conductor portion CP surrounding the hollow portion HP, and the conductor portion CP is conformally formed on a side wall and a bottom surface of a via hole in which the first via via1 is formed. In some embodiments, the thickness of the conductor portion CP a greater than skin depth. The conductor portion CP may include and/or may be at least one metal selected from Al, Ti, Cr, Fe, Co, Ni, Cu, Zn, Pd, Pt, Au, and Ag.

In some embodiments, the second via via2 may be a via for transmitting a direct current (DC) signal. In some embodiments, the second via via2 may be a fully metal-filled via to reduce DC IR drop on a trace for transmitting the direct current signal. In some embodiments, the second via via2 may be isolated from the first conductor layer M1 by an insulation pattern IP1 disposed in the first conductor layer M1 and surrounding the second via via2. In some embodiments, the second via via2 may be isolated from the second conductor layer M2 by a passivation layer (not shown) disposed in the second conductor layer M2. The insulation pattern IP1 may include a suitable inorganic and/or organic insulation material. The passivation layer may include a suitable inorganic and/or organic insulation material. The second via via2 may include and/or may be at least one metal selected from Al, Ti, Cr, Fe, Co, Ni, Cu, Zn, Pd, Pt, Au, and Ag.

The electronic element EC is disposed on the waveguide structure and is electrically connected to the second conductor layer M2. In some embodiments, the electronic element EC may include a radio frequency element, that is, the electronic element EC may be an electronic element suitable for, for example, communication fields, radar/lidar fields, reconfigurable intelligent surface (RIS) technology, or other suitable fields/technologies, but the disclosure is not limited thereto. In some embodiments, the electronic element EC may include a variable capacitor, a variable resistor, a varactor, a phase shifter, an amplifier, an antenna, a biometric sensor, a graphene sensor, other suitable electronic elements, or a combination thereof. In addition, the electronic element EC may, for example, control a transmission direction of a signal and/or improve the directivity of the electronic element through receiving the direct current signal from the second via via2, but the disclosure is not limited thereto.

The driving circuit DC is disposed under the waveguide structure and is electrically connected to the electronic element EC through the second via via2. In some embodiments, the driving circuit DC may include a thin film transistor (TFT). For example, as shown in FIG. 2A, the waveguide device 10 may include a first passivation layer pass1, a second passivation layer pass2, and a third passivation layer pass3 below the first conductor layer M1, wherein a source/drain S/D of the thin film transistor may be connected to the second via via2 through a signal trace ST2 disposed between the first passivation layer pass1 and the second passivation layer pass2, and a gate G of the thin film transistor may be connected to a gate signal through a signal trace ST3 disposed between the second passivation layer pass2 and the third passivation layer pass3. In other embodiments, as shown in FIG. 3A, the driving circuit DC may include an integrated circuit (IC). For example, the integrated circuit may be a bias voltage control IC, but the integrated circuit of the disclosure is not limited thereto. In some embodiments, the signal trace ST3 connected to the bias voltage control IC may be used as an input/output trace of the bias voltage control IC. The first passivation layer pass1, the second passivation layer pass2, and the third passivation layer pass3 may each include a suitable inorganic and/or organic insulation material. The signal trace ST2 and the signal trace ST3 may each include a conductor material. For example, the signal trace ST2 and the signal trace ST3 may include and/or be at least one metal selected from Al, Ti, Cr, Fe, Co, Ni, Cu, Zn, Pd, Pt, Au, and Ag.

Based on the above, the second via via2 for transmitting a digital signal and/or a power signal is integrated into the via array for guiding a microwave transmission direction in the waveguide structure (that is, at least one first via among the first vias via1 is replaced with the second via via2), which can not only satisfy the electrical connection requirements of the digital signal and/or the power signal, but can also prevent adding other vias for transmitting the digital signal and/or the power signal other than the via array in the waveguide structure to eliminate interference to microwave signals.

In some embodiments, please refer to FIG. 2A, FIG. 2B, and FIG. 4 at the same time. The waveguide device 10 may also include a signal trace ST1 disposed on the second conductor layer M2 and connecting the electronic element EC and the second via via2. The signal trace ST1 may include a conductor material. For example, the signal trace ST1 may include and/or be at least one metal selected from Al, Ti, Cr, Fe, Co, Ni, Cu, Zn, Pd, Pt, Au, and Ag. In some embodiments, the signal trace ST1 is used to transmit the direct current signal and has a higher resistance value and/or inductance value than traces for transmitting other signals (for example, signals such as the radio frequency signal, the ground signal, and the gate signal), so as to prevent interference to the radio frequency signal when transmitting the direct current signal. In the embodiment, the signal trace ST1 may adopt metal with relatively low conductivity (for example, ITO, IZO, IGZO, etc.) and/or metal with a thickness lower than the skin depth of the lowest operating frequency of the radio frequency signal.

In some embodiments, please refer to FIG. 2A and FIG. 2B at the same time. The waveguide device 10 may also include the signal trace ST2 disposed under the second conductor layer M2 and connecting the driving circuit DC and the second via via2. In some embodiments, the second via via2 is directly electrically connected to the signal trace ST2. The signal trace ST2 may include a conductor material. For example, the signal trace ST2 may include and/or be at least one metal selected from Al, Ti, Cr, Fe, Co, Ni, Cu, Zn, Pd, Pt, Au, and Ag. In some embodiments, the signal trace ST2 is used to transmit the direct current signal and has a higher resistance value and/or inductance value than traces for transmitting other signals (for example, signals such as the radio frequency signal, the ground signal, and the gate signal), so as to prevent interference to the radio frequency signal when transmitting the direct current signal. In the embodiment, the signal trace ST2 may use a metal with relatively low conductivity (for example, ITO, IZO, IGZO, etc.) and/or a metal with a thickness lower than the skin depth of the lowest operating frequency of the radio frequency signal.

In some embodiments, please refer to FIG. 5A and FIG. 5B at the same time. The waveguide device 10 may further include an inductance element D1 disposed under the first conductor layer M1 and electrically connected to the driving circuit DC and the second via via2. The inductance element D1 may be formed by winding the signal trace ST2 (for example, the winding pattern forms the three-dimensional inductance element shown in FIG. 5A and FIG. 5B), so that the signal trace ST2 for transmitting the direct current signal has a higher inductance value than traces for transmitting other signals (for example, signals such as the radio frequency signal, the ground signal, and the gate signal). For example, the signal trace ST2 may include a bottom trace 102 forming the inductance element D1, a top trace 104 located on the bottom trace 102, and a conductive via 106 connecting the bottom trace 102 and the top trace 104. The signal trace ST2 may also include a trace 108*a* connecting the inductance element D1 and the second via via2 and a trace 108*b* connecting the inductance element D1 and the driving circuit DC.

In some alternative embodiments, please refer to FIG. 6A and FIG. 6B at the same time. An inductance element D1' may be formed by winding the signal trace ST2 (for example, the winding pattern forms the planar inductance element shown in FIG. 6A and FIG. 6B), so that the signal trace ST2 for transmitting the direct current signal has a higher inductance value than traces for transmitting other signals (for example, signals such as the radio frequency signal, the ground signal, and the gate signal). For example, the signal trace ST2 may include a trace pattern 110 forming the inductance element D1'. The signal trace ST2 may also include a trace 112*a* connecting the inductance element D1' and the second via via2 and a trace 112*b* connecting the inductance element D1' and the driving circuit DC. In some embodiments, an opening (as shown in FIG. 6A) is formed in the first conductor layer M1 above the trace pattern 110 to prevent inductance drop caused by eddy current. In some embodiments, the opening may be formed by removing a part of the first conductor layer M1, and the removed size may be less than one quarter of the wavelength of the radio frequency signal propagating inside the waveguide structure.

In some embodiments, compared to the planar inductance element D1' shown in FIG. 6A and FIG. 6B, the eddy current generated by the three-dimensional inductance element D1 shown in FIG. 5A and FIG. 5B is less than the eddy current generated by the planar inductance element D1', so the upper first conductor layer M1 may maintain a complete plane.

In some embodiments, please refer to FIG. 2A, FIG. 2B, and FIG. 4 at the same time. The waveguide device 10 may also include a control circuit IC1 (as shown in FIG. 4) disposed on the waveguide structure (for example, on the second conductor layer M2 of the waveguide structure) and electrically connected to the electronic element EC and a radio frequency modulation element RFMC disposed on the waveguide structure (for example, on the second conductor layer M2 of the waveguide structure) and electrically connected to the control circuit IC1. In some embodiments, the radio frequency modulation element RFMC may include a varactor.

A waveguide device 20 shown in FIG. 3A and FIG. 3B is similar to the waveguide device 10 shown in FIG. 2A and FIG. 2B. The differences are that the waveguide device 20 includes a bonding structure BS connecting the first conductor layer M1 and the second conductor layer M2; the second conductor layer M2 of the waveguide device 20 includes an upper portion disposed on an insulation layer IL2 and a lower portion disposed under the insulation layer IL2; the first via via1 of the waveguide device 20 includes a portion disposed in the insulation layer IL2 to connect the upper portion and the lower portion of the second conductor layer M2; and the waveguide device 20 replaces the first passivation layer pass1 of the waveguide device 10 with a substrate SUB. In some embodiments, the first via via1 of the waveguide device 20 may also include the bonding structure BS connected to the first conductor layer M1.

In the embodiment, the bonding structure BS of the waveguide device 20 is disposed between the insulation layer IL2 and the first conductor layer M1. In some embodiments, a portion of the second via via2 above the first conductor layer M1 is electrically connected to the signal trace ST2 below through the bonding structure BS. In some embodiments, a portion of the second via via2 under the first conductor layer M1 is electrically connected to the signal trace ST1 above through the bonding structure BS. In some embodiments, the first conductor layer M1 and the second conductor layer M2 are electrically connected to each other through the conductor portion CP and the bonding structure BS of each first via via1.

In some embodiments, the bonding structure BS may include a pad BP1, a pad BP2, and a connection component BM disposed between the pad BP1 and the pad BP2. The pad BP1 and the pad BP2 may each include a conductive material such as metal. For example, the metal may be Al, Ti, Cr, Fe, Co, Ni, Cu, Zn, Pd, Pt, Au, Ag, an alloy thereof, or a combination thereof. The connection component BM may include a conductive material such as Sn, Pb, and other metal. In some embodiments, the connection component BM may be a solder ball.

In some embodiments, the substrate SUB may adopt any material suitable as the substrate SUB.

In summary, in the embodiments of the disclosure, the second via via2 for transmitting the digital signal and/or the power signal is integrated into the via array for guiding the microwave transmission direction in the waveguide structure (that is, at least one first via among the first vias via1 is replaced with the second via via2), which can not only satisfy the electrical connection requirements of the digital signal and/or the power signal, but can also prevent adding other vias for transmitting the digital signal and/or the power signal other than the via array in the waveguide structure to eliminate interference to the microwave signals.

The above embodiments are only used to illustrate, but not to limit, the technical solutions of the disclosure. Although the disclosure has been described in detail with reference to the above embodiments, persons skilled in the art should understand that the technical solutions described in the above embodiments may still be modified or some or all of the technical features thereof may be equivalently replaced. However, the modifications or replacements do not cause the essence of the corresponding technical solutions to depart from the scope of the technical solutions of the embodiments of the disclosure. Features in the embodiments may be mixed and matched for use as long as the features do not violate the spirit of the invention or conflict with each other.

Although the embodiments and the advantages of the disclosure have been disclosed above, it should be understood that any person skilled in the art may make changes, substitutions, and modifications without departing from the spirit and the scope of the disclosure, and the features of the embodiments may be arbitrarily mixed and replaced to form other new embodiments. In addition, the protection scope of the disclosure is not limited to processes, machines, manufactures, material compositions, devices, methods, and steps in the specific embodiments described in the specification. Any person skilled in the art may understand conventional or future-developed processes, machines, manufactures, material compositions, devices, methods, and steps from the content of the disclosure as long as the same may implement substantially the same functions or obtain substantially the same results as the embodiments described herein when used according to the disclosure. Therefore, the protection scope of the disclosure includes the above processes, machines, manufactures, material compositions, devices, methods, and steps. In addition, each claim constitutes a separate embodiment, and the protection scope of the disclosure further includes combinations of the claims and the embodiments. The protection scope of the disclosure should be defined by the appended claims.

What is claimed is:

1. A waveguide device, comprising:

a waveguide structure, comprising:

a first conductor layer;

a second conductor layer, disposed above the first conductor layer;

an insulation layer, disposed between the first conductor layer and the second conductor layer; and a via array, disposed in the insulation layer and comprising:

a plurality of first vias, arranged in a first direction and configured on two opposite sides of the insulation layer in a second direction, wherein the first direction crosses the second direction and each of the plurality of first vias comprises a hollow portion and a conductor portion surrounding the hollow portion; and at least one second via, configured between two adjacent first vias of the plurality of first vias in the first direction and penetrating the first conductor layer and the second conductor layer;

an electronic element, disposed on the waveguide structure and electrically connected to the second conductor layer; and a driving circuit, disposed below the waveguide structure and electrically connected to the electronic element through the at least one second via.

2. The waveguide device according to claim 1, further comprising:

a first signal trace, disposed on the second conductor layer and connecting the electronic element and the at least one second via, wherein the first signal trace is used to transmit a direct current signal and has a higher resistance value and/or inductance value than traces for transmitting other signals.

3. The waveguide device according to claim 2, further comprising:

a second signal trace, disposed under the second conductor layer and connecting the driving circuit and the at least one second via, wherein the second signal trace is used to transmit the direct current signal and has a higher resistance value and/or inductance value than the traces for transmitting the other signals.

4. The waveguide device according to claim 3, wherein the second signal trace is disposed under the first conductor layer.

5. The waveguide device according to claim 3, wherein the second signal trace is configured to comprise a winding pattern forming an inductance element.

6. The waveguide device according to claim 5, wherein the winding pattern is configured at a same level to form a planar inductance element or the winding pattern is configured at different levels to form a three-dimensional inductance element.

7. The waveguide device according to claim 3, further comprising:

a third signal trace, disposed under the first conductor layer, wherein the driving circuit comprises a thin film transistor, a gate of the thin film transistor is connected to a gate signal through the third signal trace, and a resistance value and/or an inductance value of the second signal trace is greater than a resistance value and/or an inductance value of the third signal trace.

8. The waveguide device according to claim 7, wherein the third signal trace and the second signal trace are disposed at different levels.

9. The waveguide device according to claim 3, further comprising:

a third signal trace, disposed under the first conductor layer, wherein the driving circuit comprises an integrated circuit, the third signal trace is used as an input/output trace of the integrated circuit, and a resistance value and/or an inductance value of the second signal trace is greater than a resistance value and/or an inductance value of the third signal trace.

10. The waveguide device according to claim 9, wherein the third signal trace and the second signal trace are disposed at a same level.

11. The waveguide device according to claim 3, wherein the at least one second via is directly electrically connected to the second signal trace.

12. The waveguide device according to claim 3, further comprising:

a bonding structure, disposed between the insulation layer and the first conductor layer, wherein the at least one second via is electrically connected to the second signal trace through the bonding structure.

13. The waveguide device according to claim 12, wherein the first conductor layer and the second conductor layer are electrically connected to each other through the conductor portion and the bonding structure of each of the plurality of first vias.

14. The waveguide device according to claim 1, wherein the first conductor layer and the second conductor layer are electrically connected to each other through the conductor portion of each of the plurality of first vias.

15. The waveguide device according to claim 1, wherein the driving circuit comprises a thin film transistor.

16. The waveguide device according to claim 15, wherein the radio frequency modulation element comprises a varactor.

17. The waveguide device according to claim 1, further comprising:

a control circuit, disposed on the waveguide structure and electrically connected to the electronic element; and a radio frequency modulation element, disposed on the waveguide structure and electrically connected to the control circuit.

18. The waveguide device according to claim 1, wherein the driving circuit comprises an integrated circuit.

19. The waveguide device according to claim 1, further comprising:

an inductance element, disposed under the first conductor layer and electrically connected to the driving circuit and the at least one second via.

20. The waveguide device according to claim 1, wherein the at least one second via fills a via hole formed with the at least one second via.

* * * * *